United States Patent [19]

Prame

[11] Patent Number: 4,988,997
[45] Date of Patent: Jan. 29, 1991

[54] METHOD FOR CHARACTER CODE GENERATION

[75] Inventor: Eric S. Prame, Lidingo, Sweden

[73] Assignee: IBM Corporation, Armonk, N.Y.

[21] Appl. No.: 481,643

[22] Filed: Jan. 25, 1990

Related U.S. Application Data

[63] Continuation of Ser. No. 167,205, Mar. 11, 1988, abandoned.

[30] Foreign Application Priority Data

Apr. 7, 1987 [SE] Sweden ............................. 8701445

[51] Int. Cl.[5] ............................................. H03M 11/00
[52] U.S. Cl. ........................................ 341/25; 341/24
[58] Field of Search ................................. 341/24–26, 341/90, 106; 364/189

[56] References Cited

U.S. PATENT DOCUMENTS

| | | | |
|---|---|---|---|
| 3,967,273 | 6/1976 | Knowlton | 340/365 S |
| 4,005,388 | 1/1977 | Morley et al. | 340/365 S |
| 4,344,069 | 8/1982 | Prame | 340/365 S |
| 4,381,502 | 4/1983 | Prame | 340/365 S |
| 4,724,423 | 2/1988 | Kinoshita | 340/365 S |

Primary Examiner—William M. Shoop, Jr.
Assistant Examiner—Marc S. Hoff
Attorney, Agent, or Firm—John J. Timar

[57] ABSTRACT

In a keyboard operation two sequential keystrokes are used for generation of a character code. A rule is set up according to which some preset combinations of two sequential keystrokes are valid and others are not. The rule is implemented by storing the validity conditions into a table in a control unit. According to a preferred rule the second key to be operated must be located in a column to the right of the column where the first key is located, otherwise an error signal will be generated. The method is preferably used for a one hand keyboard with three times four keys.

4 Claims, 1 Drawing Sheet

METHOD FOR CHARACTER CODE GENERATION

This is a continuation of co-pending application Ser. No. 07/167,205 filed on March 11, 1988.

TECHNICAL FIELD

The invention described relates to a method for character code generation and more particularily to a method for character code generation in a one hand keyboard.

BACKGROUND OF THE INVENTION

The conventional three columns-four rows telephone keyboard is an example of a widely used one hand keyboard. In many applications such a keyboard would be useful for character generation purposes, provided that the number of character codes which can be generated is sufficient. One solution to the problem of increasing the number of available character codes without increasing the number of keys is to use two or more keys for the code generation of one character.

The main application areas for a one hand keyboard are as follows:
On-line programming.
Word processing systems.
Graphics systems needing one hand to move cursor and one hand to type.
Use of a computer while operating an airplane or other vehicle.
Systems for handicapped people.
Weapons systems requiring communications with a computer.
Small computers requiring a small keyboard (electronic notebook).

PRIOR ART PRESENTATION

U.S. Pat. No. 4,344,069 describes a method for character generation where two keys are depressed in a sequence for the generation of one character code. The problem of synchronization, i.e. the problem of avoiding the combination of two non-paired keystrokes as a character code is avoided by the rule of keeping the first key in a pair depressed when the second key is being depressed (overlapping mode).

In many keyboard applications using plural key actuations for generation of one character code it would be easier for the operator to be free from the requirement of striking two keys simultaneously. The present invention provides a solution to such a problem.

SUMMARY OF THE INVENTION

The present invention is disclosed in the attached claims.

The invention as claimed is a method for character code generation whereby a control unit such as a microcomputer scans sequential keystrokes of a keyboard, combines every two sequential strokes into a pair, checks whether the pair represents a valid combination of two sequential keystrokes as predefined in a validity table in the control unit and generates an error signal in case the two sequential keystrokes represent a non-valid combination.

An advantage of the invention is that a character code can be generated by a sequence of two keystrokes without the need of an overlapping mode.

Another advantage of the invention is that the synchronization is maintained, i.e. correct keystrokes are paired into character codes.

Still another advantage of the invention is that a large number of character codes can be generated by a few keys on a keyboard.

DESCRIPTION

The present invention will now be described in detail below with reference to the attached drawing in which:

FIG. 1 is a block diagram of a keyboard and a control unit to be used according to the present invention.

DETAILED DESCRIPTION OF THE INVENTION

Figure 1:
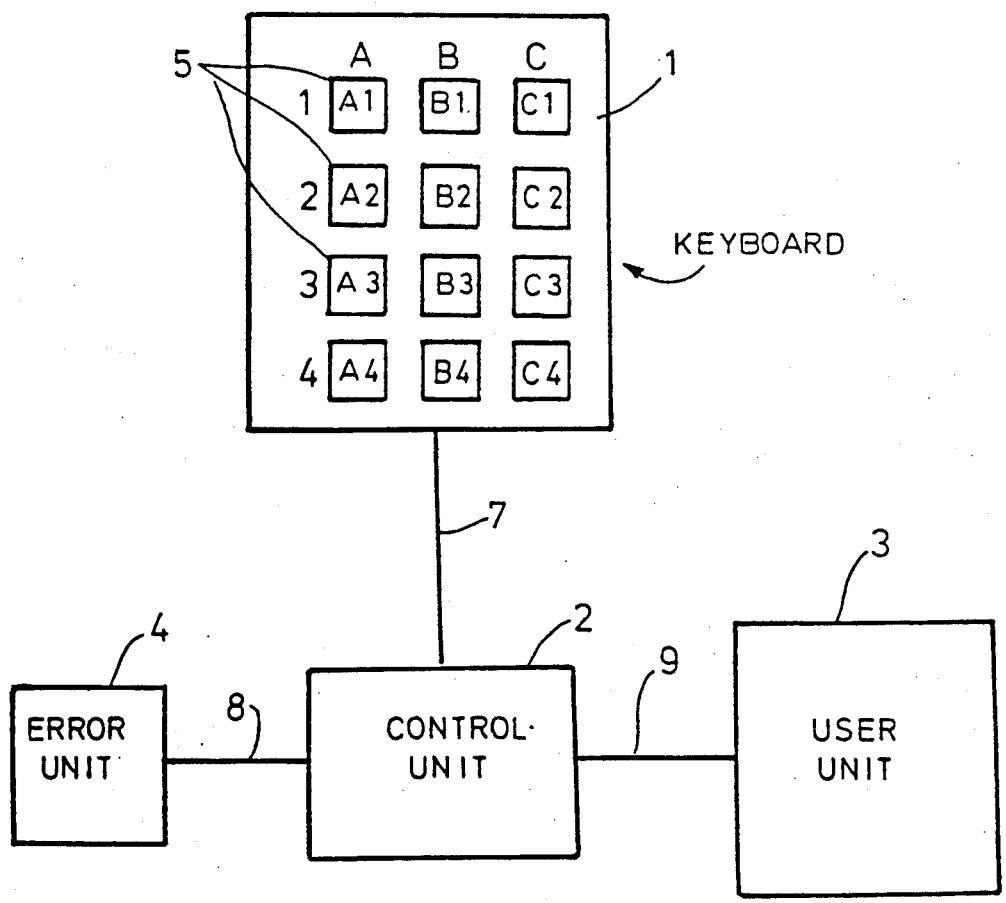

In accordance with FIG. 1 a keyboard 1 comprises a matrix of 12 keys 5 arranged in three columns and four rows. A control unit 2, preferably a microcomputer, is used to sense keystrokes produced by a keyboard operator. The operator operates the keyboard with one hand and strikes two keys in a sequence for the generation of a character code. The control unit senses the keystrokes via a line 7, combines the keycodes for two consecutive strokes and generates a corresponding character code. In case the generated character code is a valid code, the generated character code is sent over a line 9 to a user unit 3, for instance a local network. In case, however, the generated code is invalid, an error signal is sent over a line 8 to an error unit 4.

According to a preferred embodiment of the present invention a specific rule for the method of character generation is set up whereby a valid character code is generated by two consecutive keystrokes, the second one of the two operated keys being located in a column to the right of the column where the first operated key is located. A more general rule is that the second key of a pair of keys for character code generation must be located in a column or a row displaced in a predetermined direction from the column or the row where the first key is located.

Referring now to the attached drawing it is assumed that a first character code should be generated by depressing two keys A1 and B2 in a sequence and then as the next pair the keys B3 and C2. As a third pair the keys A3 and C1 might be operated. It is further assumed that a typing error will occur as follows:

One key is depressed twice. Such an error is immediately detected by the control unit because of the violation of the specific rule of the second key being located to the right of the first key. An error signal is hence sent to the error unit 4 and the two subsequent characters will be correctly generated.

One key is missing. Assume that A1 is missing. B2 and B3 will then be paired for the first character and the rule is violated because these two keys are on the same column. In case, however A1 is operated correctly but B2 is missing, then A1 will be paired with B3, the first key of the second pair and a valid character is generated for the combination of A1-B3. Next however C2, the second key in the second pair, will be paired with A3, The first key in the third pair. Then the rule will be violated.

According to the above examples it can be seen that a typing error will either be detected immediately or as a one character delayed error. In case of a delayed error, two characters are in error, the present character (B3-C2) to be generated and the previous character (A1-B3) already generated.

A double key error might be undetected by the keys that follow will be correct. Such an error may result in one faulty character or in two. In the latter case the faulty characters always lie next to each other. A double key error is thus very similar to a normal typing error and will be detected by proof reading.

From a human factor point of view it seems to be the best solution to have the second key in a pair located in a column to the right of the first key, as explained in the example above. According to another embodiment of the present invention, however, the rule to be followed states that the second key in a character generating pair is located in a column to the left of the corresponding first key column. According to still another embodiment the first key in a pair is located on a first row and the second key on a row below or above respectively.

More generally it can be said that the present invention discloses a method for character code generation, the method stating that two keys are pushed in a sequence, the first key being located on a first line displaced in a predefined direction from a second line, parallel to the first line, on which second line the second key is located.

In addition to the function described above, a time-out function should be provided to give an error signal after a specified time if one keystroke only has been detected by the controller.

A keyboard as described above allows fast keying as the keys can be stroked without any synchronization considerations. In addition the specific rule of a left key before a right key facilitates the keying process as it introduces a twisting movement of the arm and the more so as the movement is performed rhythmically i.e. the first key is always to the left of the second.

It should be considered that the described embodiments are special cases of a general rule predefining any possible two sequential key combinations of all combinations as valid combinations and the remaining combinations as invalid.

In accordance with a general or specific rule the control unit 2 will check the validity of each two sequential keystrokes. This is done by loading a table for valid-non valid combinations into the control unit before the keyboard operation for sensing keys is started. When the normal keying operation then starts, the control unit accesses the table for each sensed key code pair.

In case the sensed code is invalid, in accordance with the stored table value, an error signal is generated.

I claim:

1. A method for the detection of erroneous keystrokes in a data entry system having a keyboard, control unit and an error unit wherein each character in a stream of input characters is generated by pairs of two sequential keystrokes, said method comprising the steps of:

striking a first key and then a second key in sequence without overlapping said keystrokes, said striking of keys being characterized in that the position of the second key in relation to the first key of said sequence is sensed by the control unit;

decoding said keystroke sequence according to a pre-established rule stating that the second key of each keystroke pair is always displaced from the position of the first key in said keystroke pair in the same predefined direction in order for the combination to be decoded as valid;

generating the character corresponding to each keystroke pair decoded as valid; and generating an error signal for each keystroke pair decoded as invalid immediately following said decoding and restoring synchronism to the remaining characters in said stream of input characters.

2. The method of claim 1 wherein the second key of each keystroke pair is always in a column displaced in a predefined direction from the column in which the first key is located.

3. The method of claim 1 wherein the second key of each keystroke pair is always in a row displaced in a predefined direction from the row in which the first key is located.

4. The method of claim 1 including the step of generating a time-out signal at a predetermined time following the striking of a first key without the corresponding striking of a second key.

* * * * *